United States Patent [19]
Burke et al.

[11] Patent Number: 5,904,495
[45] Date of Patent: May 18, 1999

[54] INTERCONNECTION TECHNIQUE FOR HYBRID INTEGRATED DEVICES

[75] Inventors: Barry E. Burke, Lexington; Bernard B. Kosicki, Acton, both of Mass.

[73] Assignee: Massachusetts Institute of Technology, Cambridge, Mass.

[21] Appl. No.: 08/873,123

[22] Filed: Jun. 11, 1997

[51] Int. Cl.$^6$ .......................... H01L 21/00; H01L 21/44; H01L 21/48; H01L 21/30
[52] U.S. Cl. .......................... 438/98; 438/118; 438/459; 438/977
[58] Field of Search .................................... 438/455, 459, 438/977, 84, 118, 98, 102, 95

[56] References Cited

U.S. PATENT DOCUMENTS

| | | |
|---|---|---|
| 4,104,674 | 8/1978 | Lorenze, Jr. et al. . |
| 4,547,792 | 10/1985 | Sclar . |
| 5,162,251 | 11/1992 | Poole et al. . |
| 5,234,860 | 8/1993 | Gluck . |
| 5,244,817 | 9/1993 | Hawkins et al. . |
| 5,373,184 | 12/1994 | Moslehi . |
| 5,414,726 | 5/1995 | Staller et al. . |
| 5,426,072 | 6/1995 | Finnila . |
| 5,455,202 | 10/1995 | Malloy et al. . |
| 5,472,914 | 12/1995 | Martin et al. . |
| 5,485,010 | 1/1996 | Owen et al. . |
| 5,489,554 | 2/1996 | Gates ........................................ 437/208 |
| 5,504,032 | 4/1996 | Gessner et al. . |
| 5,751,049 | 5/1998 | Goodwin ................................ 257/440 |

FOREIGN PATENT DOCUMENTS 0 773 436 A2   5/1997   European Pat. Off. .

OTHER PUBLICATIONS

International Symposium on VLSI Technology, Systems and Applications, May 1989, pp. 98–101, "A New Process for Thinned Back–Illuminated CCD Imager Devices," by Huang C M et al.

Modern Solder Technology for Competitive Electronics Manufacturing, McGraw–Hill, Incl., 1996, pp. 21–27, Chpt.2.2 "Flip–Chip Technology", by Jennie S. Hwang, Ph.D.

Multichip Modules and Related Technologies MCM, TAB, and COB Design, McGraw–Hill, Inc., 1994, pp. 78–85, Chpt. 4.4, "Flip–Chip Technology", by Ginsberg et al.

177th Electrochemical Society Meeting, May 1990, Abstract No. 306, pp. 457–459 "Semiconductor Wafer Bonding and Thinning Technique", by Lehmann, et al.

Primary Examiner—Brian Dutton
Attorney, Agent, or Firm—Samuels, Gauthier & Stevens

[57] ABSTRACT

A hybrid integrated circuit and method of fabricating a hybrid integrated circuit. A first wafer is provided having a first surface with a first electrical contact for a first active circuit associated therewith and a second surface. A second wafer is provided having a third surface with a second electrical contact for a second active circuit associated therewith and a fourth surface, the second wafer being chemically thinned at the fourth surface. The first and second wafers are bonded together at an interface between the first and third surfaces such that the first and second electrical contacts are relatively aligned with one another. The fourth surface of the second wafer is processed to define an access via to both the first and second contacts. An electrical interconnection is formed between the first and second contacts within the access via so that the first and second active circuits are electrically interconnected.

13 Claims, 4 Drawing Sheets

INTERCONNECTION TECHNIQUE FOR HYBRID INTEGRATED DEVICES

This invention was made with government support under Contract No. F19628-95-C-0002 awarded by the U.S. Air Force. The government has certain rights in the invention.

BACKGROUND OF THE INVENTION

The invention relates to interconnecting semiconductor devices to fabricate hybrid integrated circuits.

Hybrid integrated circuits are an important class of circuits in which two or more devices, or possibly dissimilar materials, are interconnected to perform a function that is not feasible with a monolithic device. Typically, connections are made to the devices using wire bonding to pads arranged around the perimeter of the device. Other methods such as automated tape bonding and beam leads, are also limited to contacts being made to the periphery of the device.

For some time it has been realized that applications exist for which the method of attaching leads around the edge of the device is inadequate. Primary examples are imaging arrays, in which a photosensitive array is bonded to a second device that performs amplification and readout functions, and random logic functions in which the number of signal leads are too large to be placed all along the perimeter of the device. The most common approach to imaging arrays is the use of indium bump bonding, which does not require the use of elevated temperatures. For random logic functions applications the technology of solder bumps has been widely employed.

Hybrid imaging arrays are an important use of indium bump bonding for medium-and far-infrared detection, as well as potentially the hard x-ray and gamma-ray region. In these portions of the spectrum ($\lambda$)1000 nm and $\lambda$(0.1 nm, respectively) silicon itself has no useful response, while the materials that are sensitive in these regimes (HgCdTe, InSb, CdTe, Hgl etc.) lack a well-developed and high-yield technology for integrated readout circuitry. Although it has been in development for many years, the indium bump-bonding approach is thought to be expensive and difficult to perform, and for large arrays involving thousands of bumps the probability is very high that at least a few bumps will fail to make electrical connection.

Another approach to the problem is to grow the radiation-sensitive material directly on the silicon readout chip. This has several problems, such as compatibility between the epilayer growth conditions and the silicon device, the generally inferior quality of heteroepitaxially grown material compared to homoepitaxially or bulk-grown material, and limitations on the practical thickness of the epitaxial layers. The latter is particularly important for hard x-ray and gamma-ray imaging, where the detector material may need to be hundreds of $\mu$m thick for useful sensitivity.

SUMMARY OF THE INVENTION

Accordingly the invention provides a hybrid integrated circuit and method of fabricating a hybrid integrated circuit. A first wafer is provided having a first surface with a first electrical contact for a first active circuit associated therewith and a second surface. A second wafer is provided having a third surface with a second electrical contact for a second active circuit associated therewith and a fourth surface, the second wafer being chemically thinned at the fourth surface. The first and second wafers are bonded together at an interface between the first and third surfaces such that the first and second electrical contacts are relatively aligned with one another. The fourth surface of the second wafer is processed to define an access via to both the first and second contacts. An electrical interconnection is formed between the first and second contacts within the access via so that the first and second active circuits are electrically interconnected.

DETAILED DESCRIPTION OF THE ILLUSTRATED EMBODIMENTS

The present invention involves a new approach for hybrid device fabrication that features massively parallel interconnections and potentially higher yield and greater ease of manufacturing. The approach is an extension of the precision thinning and bonding technology, which has been used extensively to make back-illuminated (BI) silicon CCD imaging detectors. The BI process is described in Huang et al., "A New Process for Thinned, Back-Illuminated CCD Imager Devices", International Symposium on VLSI Technology Systems and Applications (1989), incorporated herein by reference.

Figure 1A:
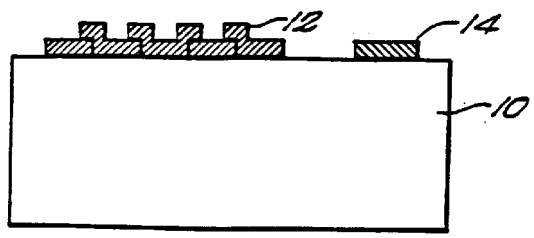
FIGS. 1A–1F illustrate in cross section a back-illuminated silicon process to fabricate a conventional CCD imager.
Figure 1B:
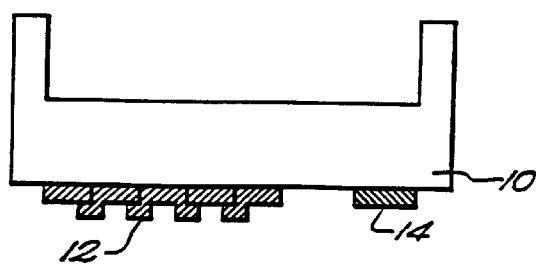
Figure 1C:
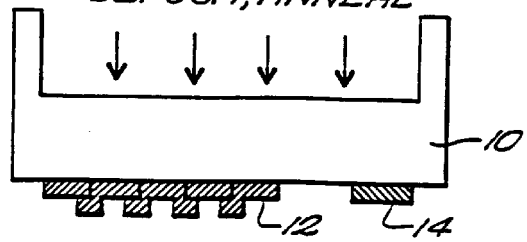
Figure 1D:
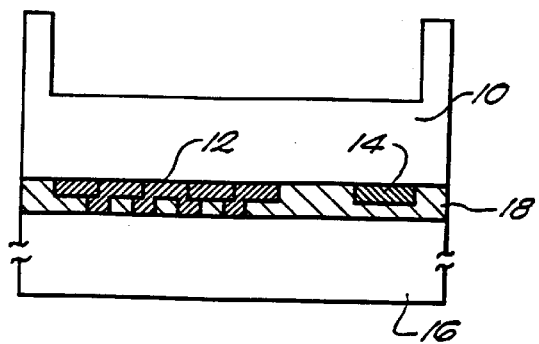
Figure 1E:
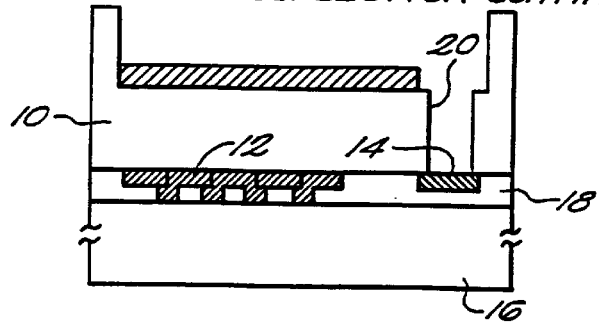
Figure 1F:
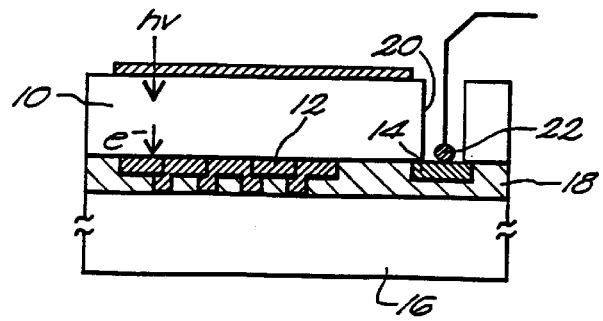

FIGS. 1A–1F illustrate in cross section the BI process as is currently practiced for CCD imagers. An active device wafer 10 such as a front illuminated wafer assembly, having an active circuit 12 and electrical contact 14, is chemically thinned to as little as a few $\mu$m thickness and treated in accordance with a conventional thinning process as shown in FIGS. 1A–1C. The thinned active wafer 10 is then bonded to an electrically inactive support/carrier substrate wafer 16 with an epoxy layer 18 as shown in FIG. 1D. A further etching step removes the silicon above the metallic electrical contact 14 to create an access via 20 as shown in FIG. 1E. In addition, deposits forming a light shield and antireflection coating are provided to complete the device.

At this point in the fabrication process, the electrical contact 14, which was previously on the top of the non-thinned active wafer 10, is now separated from the carrier wafer by about 5 $\mu$m of epoxy layer 18 and approximately 2 $\mu$m of scratch-prevention glass. In the present practice, the carrier wafer is passive electrically and acts as a mechanical support only, and the contact 14 is wire-bonded via lead 22 to a package.

In accordance with the present invention, the active device wafer to be thinned is bonded to another active device wafer having a photosensitive array or a logic device rather than a carrier wafer having no purpose other than support. The device to be thinned and bonded can be any silicon circuit such as CCD imagers or Si microprocessor circuits.

Figure 2A:
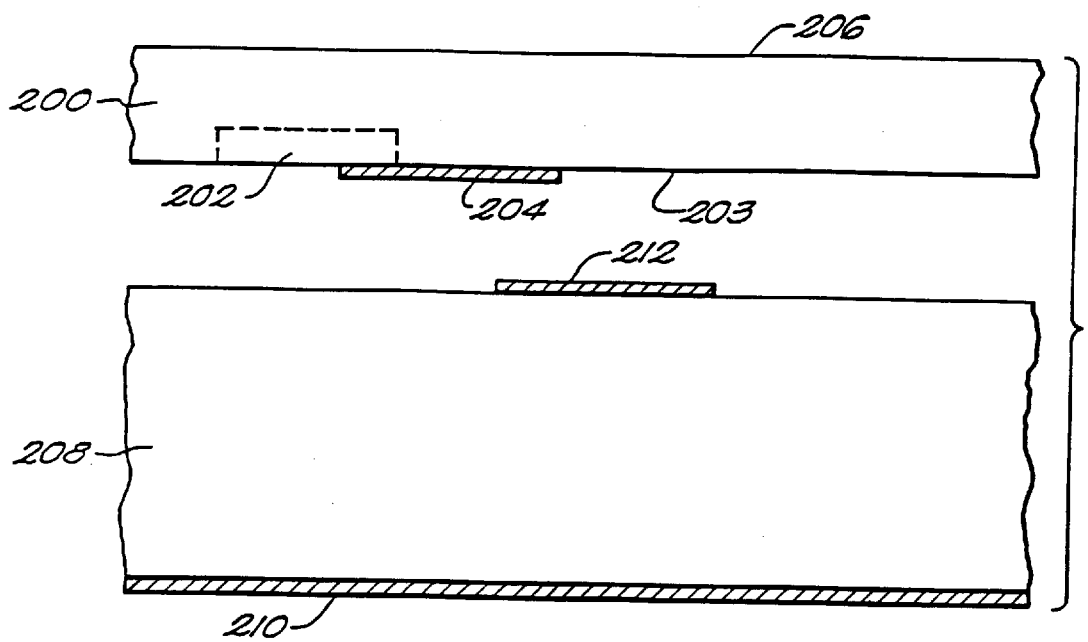
FIGS. 2A–2D illustrate in cross section a process of fabricating a hybrid integrated circuit and the resulting hybrid integrated circuit with massively parallel interconnections.

FIGS. 2A–2D illustrate an exemplary semiconductor device with an imaging application fabricated in accordance with the invention. FIG. 2A shows a first active device wafer 200. The wafer is a conventional silicon wafer having an active circuit 202 configured on an active surface 203 thereof. The active circuit can be fabricated by conventional methods of epitaxial layer growth, ion implantation and diffusion as is well known to those of skill in the art. For purposes of illustrating the invention, the active circuit 202 is the input region of a CCD or preamplifier device of a readout circuit or readout chip. The active circuit has associated therewith electrical contacts 204, which are made for example by conventional metal evaporization techniques. The wafer 200 is thinned on the opposite surface 206 in accordance with conventional thinning techniques as described above.

A second active device wafer 208 of a desired radiation-sensitive material, such as CdTe for hard x-rays or HgCdTe for the far infrared, has a continuous bias electrode 210 configured on the bottom portion of the wafer. An electrode array of electrical contacts 212 is provided on the upper surface thereof, each contact corresponding to the desired individual pixels of the imaging array. The wafer 208 in the illustrated example corresponds to a radiation detection wafer.

Figure 2B:
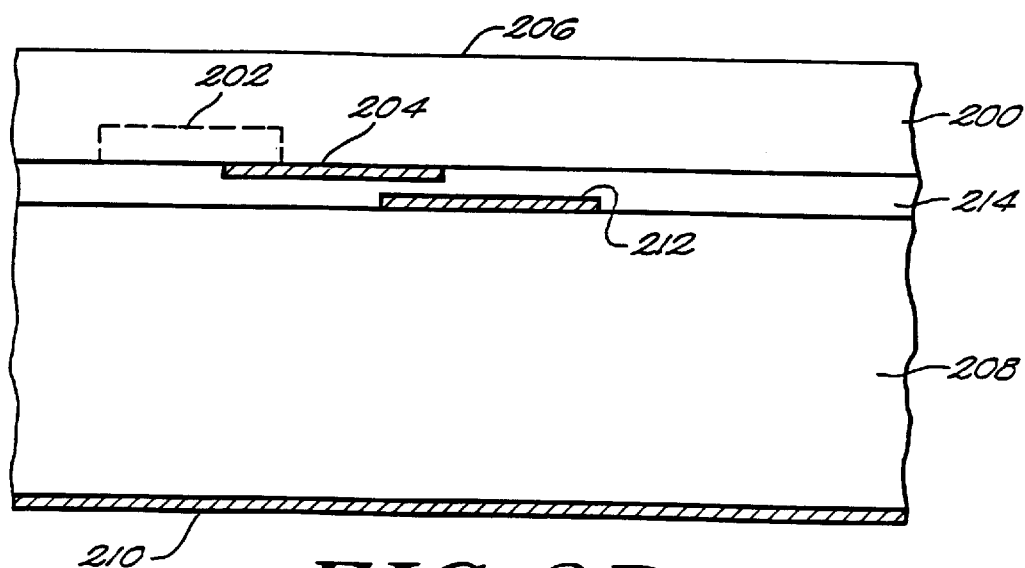

FIG. 2B shows the first active device wafer 200 being bonded to the second active device wafer 208 in a conventional manner with a bonding layer 214. The bonding layer comprises a non-conductive epoxy or oxide based adhesive which serves to adhere the wafers together and to electrically isolate the circuits associated with each wafer. During the bonding process, the first and second wafers are aligned such that the electrical contacts 204 of the first wafer are in proximity to the corresponding electrical contacts 212 of the second wafer.

Figure 2C:
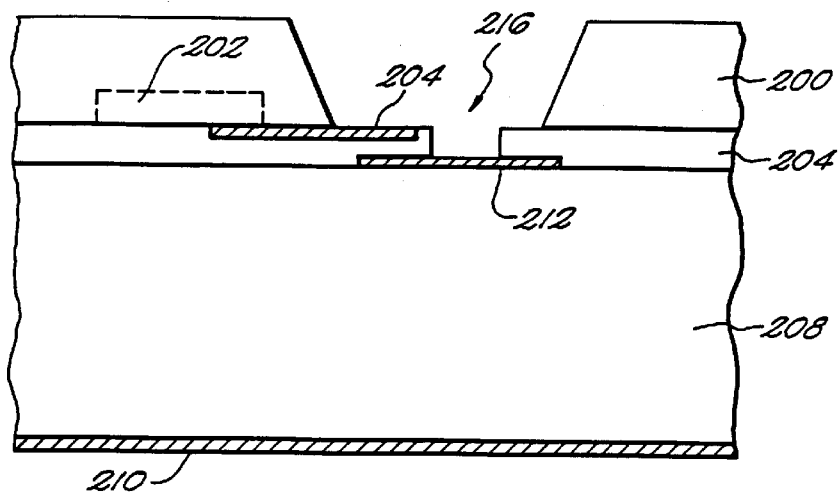

In accordance with FIG. 2C, the thinned silicon wafer, any oxide layers and epoxy over each detector electrode are etched away in a conventional manner to form an access via 216 exposing both an contact 212 of the second active device wafer and its corresponding contact on the first active device wafer.

Figure 2D:
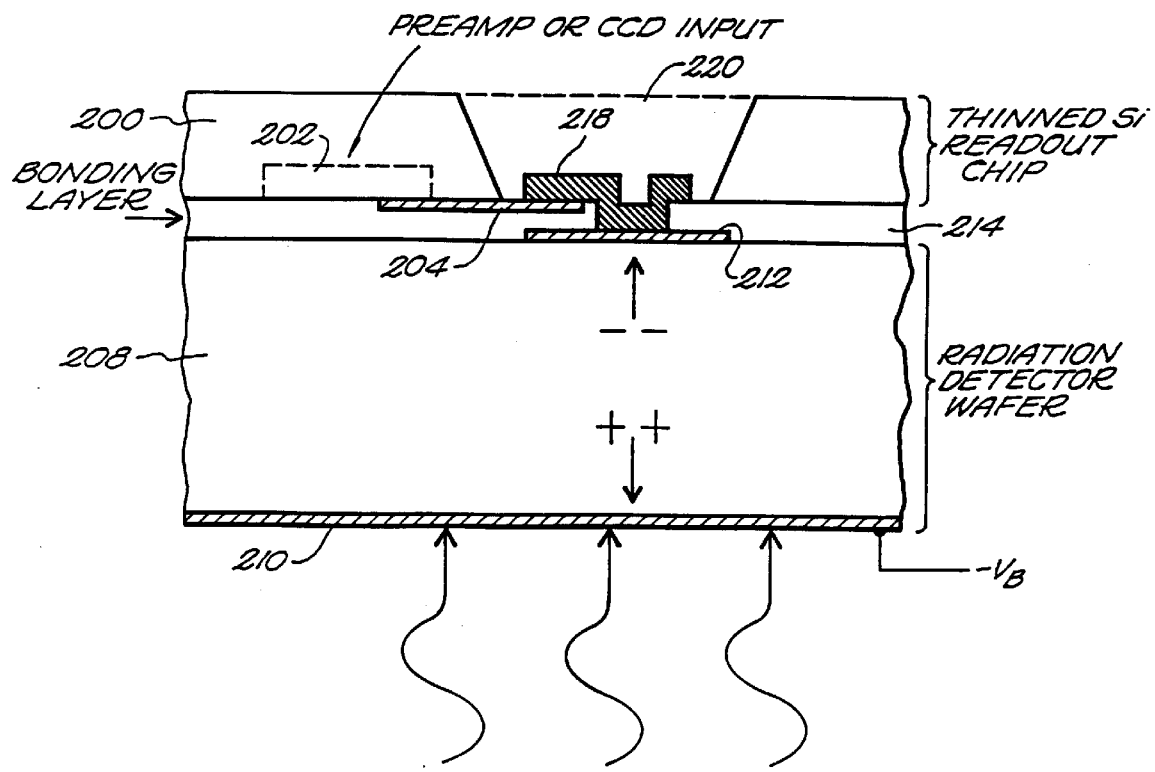

As shown in FIG. 2D, a metal electrode 218 connecting the contacts 204 and 212 can then be deposited within the via 216. Thereafter, an insulating layer 220 such as an oxide layer is provided to electrically insulate and isolate the connecting electrode 218. The resulting assembly is a hybrid integrated circuit, in the illustrated example a hybrid radiation detector, in which the active devices on each of the bonded wafers are interconnected in parallel on a massive scale, depending on the number of connections required. In the illustrated example, the radiation detector would require interconnections at each pixel location.

The benefits of this technology over the conventional bump bonding technology are as follows. The massively parallel interconnection process of the invention results in higher yields of devices. The invention provides an opportunity to rework individual bonds or the entire array if the first attempt is not successful, in contrast to bump-bonding schemes. The invention results in higher density of bonds. The physical size of the bond area will be approximately the same as the thickness of the thinned wafer plus the bonding layer (typically less than 20 μm total). In addition, the invention provides for the possibility of multi-layer circuits. The same procedure can be repeated with a third layer using the two-device layer as a substrate, etc.

It will be appreciated that the interconnection process and resulting hybrid circuits are not limited to the specific hardware examples provided herein for purposes of illustrating the invention. The interconnection technique of the invention is intended for use with any number of wafers having active circuits thereon requiring electrical interconnections.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A method of fabricating a semiconductor device, comprising:

providing a first wafer having a first surface with a first electrical contact associated therewith and a second surface;

providing a second wafer having a third surface with a second electrical contact associated therewith and a fourth surface, said second wafer being thinned at said fourth surface;

coupling said first and second wafers together at an interface between said first and third surfaces such that said first and second electrical contacts are relatively aligned with one another;

processing said fourth surface of said second wafer to define an access via to both said first and second contacts; and forming an electrical interconnection between said first and second contacts within said access via.

2. The method of claim 1, further comprising the step of providing an insulative layer over said electrical interconnection within said access via.

3. The method of claim 1, wherein said electrical interconnection comprises a metallic electrode.

4. The method of claim 1, wherein said first wafer comprises a radiation detector device.

5. The method of claim 4, wherein said second wafer comprises a readout chip.

6. A method of fabricating a hybrid integrated circuit, comprising:

providing a first wafer having a first surface with a first electrical contact for a first active circuit associated therewith and a second surface;

providing a second wafer having a third surface with a second electrical contact for a second active circuit associated therewith and a fourth surface, said second wafer being chemically thinned at said fourth surface;

bonding said first and second wafers together at an interface between said first and third surfaces such that said first and second electrical contacts are relatively aligned with one another;

processing said fourth surface of said second wafer to define an access via to both said first and second contacts; and forming an electrical interconnection between said first and second contacts within said access via so that said first and second active circuits are electrically interconnected.

7. The method of claim 6, wherein said first wafer comprises a radiation detector device.

8. The method of claim 7, wherein said second wafer comprises a readout chip.

9. The method of claim 8, wherein said hybrid integrated circuit comprises a hybrid radiation detector.

10. A hybrid integrated circuit, comprising:

a first wafer having a first surface with a first electrical contact for a first active circuit associated therewith and a second surface;

a second wafer having a third surface with a second electrical contact for a second active circuit associated therewith and a fourth surface, said second wafer being chemically thinned at said fourth surface, said first and second wafers being bonded together at an interface between said first and third surfaces such that said first and second electrical contacts are relatively aligned with one another;

an access via to both said first and second contacts from said fourth surface; and an electrical interconnection between said first and second contacts within said access via so that said first and second active circuits are electrically interconnected.

11. The method of claim 10, wherein said first wafer comprises a radiation detector device.

12. The method of claim 11, wherein said second wafer comprises a readout chip.

13. The method of claim 12, wherein said hybrid integrated circuit comprises a hybrid radiation detector.

* * * * *